United States Patent
Inoue et al.

(10) Patent No.: US 8,227,958 B2
(45) Date of Patent: Jul. 24, 2012

(54) PIEZOELECTRIC DEVICES AND METHODS FOR MANUFACTURING SAME

(75) Inventors: Takahiro Inoue, Saitama (JP); Takefumi Saito, Saitama (JP); Mitoshi Umeki, Saitama (JP); Ryoichi Ichikawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 243 days.

(21) Appl. No.: 12/703,473

(22) Filed: Feb. 10, 2010

(65) Prior Publication Data

US 2010/0201221 A1 Aug. 12, 2010

(30) Foreign Application Priority Data

Feb. 10, 2009 (JP) .................... 2009-028144

(51) Int. Cl.
*H01L 41/04* (2006.01)
(52) U.S. Cl. .................. 310/344; 310/340; 310/370
(58) Field of Classification Search .................. 310/340, 310/344, 370
See application file for complete search history.

(56) References Cited

U.S. PATENT DOCUMENTS

| | | | |
|---|---|---|---|
| 5,596,243 A | 1/1997 | Tsuru et al. | |
| 6,960,870 B2 | 11/2005 | Kikushima et al. | |
| 6,969,942 B2 * | 11/2005 | Takeshima et al. | 310/324 |
| 7,564,177 B2 * | 7/2009 | Yoshimatsu et al. | 310/365 |
| 7,834,525 B2 * | 11/2010 | Ibata et al. | 310/351 |
| 2006/0290238 A1 * | 12/2006 | Ozaki | 310/340 |
| 2007/0006434 A1 * | 1/2007 | Aoki | 29/25.35 |
| 2007/0046151 A1 * | 3/2007 | Aratake | 310/344 |
| 2007/0057597 A1 * | 3/2007 | Aoki | 310/313 B |
| 2007/0058003 A1 * | 3/2007 | Aoki | 347/68 |
| 2008/0277771 A1 * | 11/2008 | Higashi et al. | 257/690 |
| 2009/0051245 A1 * | 2/2009 | Takayama et al. | 310/313 R |

FOREIGN PATENT DOCUMENTS

| | | |
|---|---|---|
| JP | 06-343017 | 12/1994 |
| JP | 08-316762 | 11/1996 |
| JP | 10-284971 | 10/1998 |
| JP | 11-103230 | 4/1999 |
| JP | 2001-226142 | 8/2001 |
| JP | 2004-254238 | 9/2004 |
| JP | 2008-211543 | 9/2008 |

OTHER PUBLICATIONS

Office Action for related Japanese Patent Application No. 2009-028144, 6 pages, date unknown.

* cited by examiner

*Primary Examiner* — Walter Benson
*Assistant Examiner* — Bryan Gordon
(74) *Attorney, Agent, or Firm* — Klarquist Sparkman, LLP

(57) ABSTRACT

An exemplary piezoelectric vibrating device includes a piezoelectric frame that supports and surrounds a tuning-fork type piezoelectric vibrating piece having a pair of vibrating arms. The device also includes a lid and a package base that are siloxane-bonded to the frame. The lid defines at least one frequency-adjustment hole extending through the thickness dimension of the lid from an inner major surface thereof (facing the frame) to an outer major surface of the lid. The package base defines at least one through-hole electrode passing via a respective electrode through-hole through the thickness of the base from an inner major surface thereof (facing the frame) to the outer major surface thereof. The electrode is connected to the piezoelectric vibrating piece. The lid and base include external electrodes, made of an electrically conductive material, that cover the through-holes and frequency-adjustment hole(s).

30 Claims, 5 Drawing Sheets

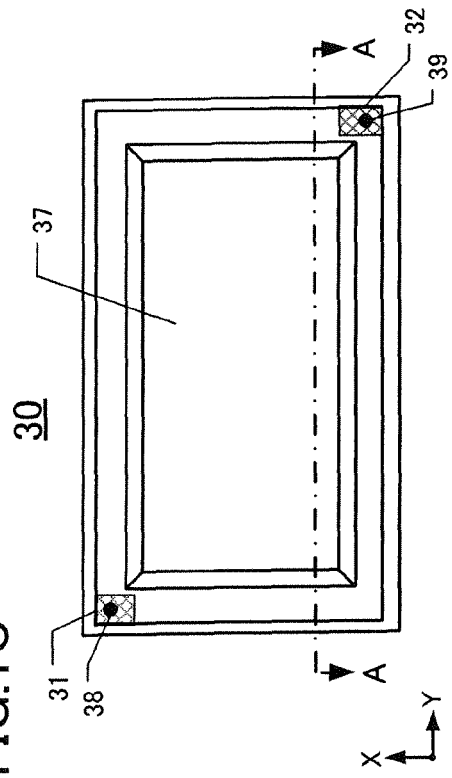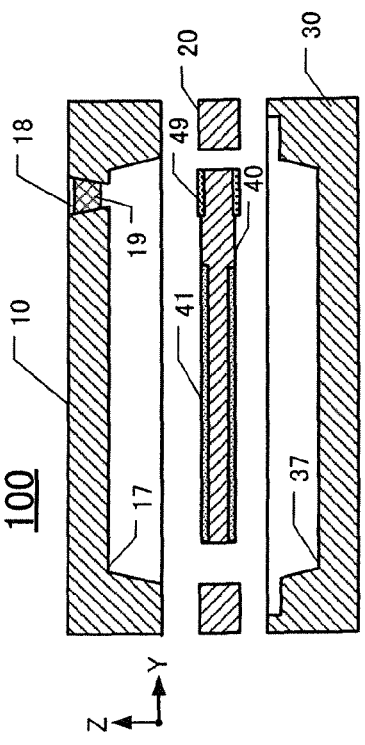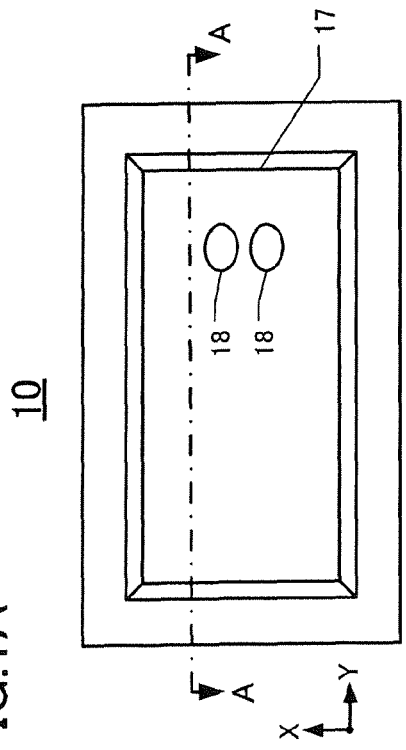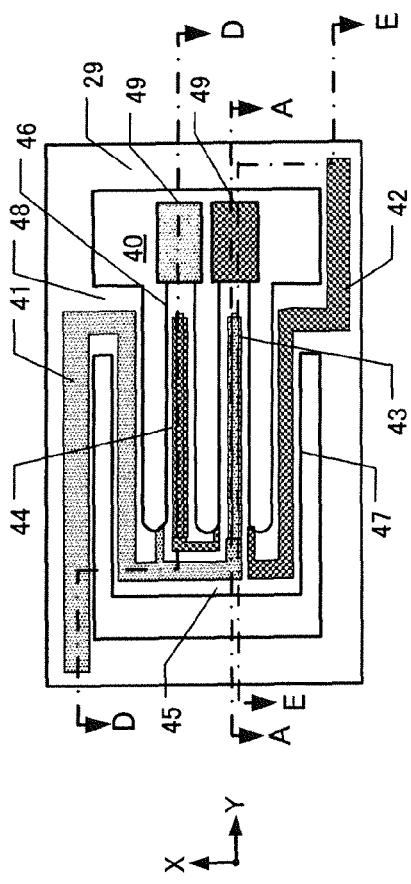

PIEZOELECTRIC DEVICES AND METHODS FOR MANUFACTURING SAME

CROSS-REFERENCE TO RELATED APPLICATION

This application claims priority to and the benefit of Japan Patent Application No. 2009-028144, filed on Feb. 10, 2009, in the Japan Patent Office, the disclosure of which is incorporated herein by reference in its entirety.

FIELD

This disclosure pertains to, inter alia, piezoelectric devices comprising a tuning-fork type piezoelectric vibrating piece enclosed in a package.

DESCRIPTION OF THE RELATED ART

Various types of clocks, home electric appliances, and consumer electronics, and various types of commercial/industrial electrical apparatus such as Office-Automation (OA) devices utilize at least one oscillator. These oscillators typically are manufactured by packaging a piezoelectric resonator, a piezoelectric vibrating device, or an IC chip as a clock source for addition to and use by an electronic circuit of the apparatus. In other apparatus, piezoelectric timing devices such as real-time clock modules are widely used.

A conventional piezoelectric device comprises piezoelectric vibrating piece, a package base, and a lid. The piezoelectric vibrating piece is attached to an integral base (not the same as the package base), which anchors the piezoelectric vibrating piece and allows the piezoelectric vibrating piece to be sandwiched between the package base and the lid. The piezoelectric vibrating piece, package base, and lid are bonded together to form a package defining an interior space in which the piezoelectric vibrating piece is situated. On the package base and lid are respective connection electrodes for making connections to and from the piezoelectric vibrating piece. Anodic bonding is typically used for bonding the piezoelectric vibrating piece to the lid and the package base. This bonding also involves the connection electrodes.

In a conventional method for manufacturing such piezoelectric devices, a first step involves etching outline profiles of the lid and package base in respective glass wafers. Next, a crystal wafer is etched to form outline profiles of piezoelectric vibrating pieces (many such pieces are simultaneously formed in a single crystal wafer). One or more respective electrodes are formed on each piezoelectric vibrating piece. Then, the piezoelectric vibrating pieces are bonded to respective lids and package bases by anodic bonding to form respective packages in which respective piezoelectric vibrating pieces are sealed inside. (Usually, a crystal wafer defining many piezoelectric vibrating pieces is sandwiched between a glass lid wafer and a glass package-base wafer defining respective lids and package bases; the wafers are registered with each other, brought together, and subjected to anodic bonding to form all the devices simultaneously.) The resulting bonded-wafer wafer sandwich is cut ("diced") to separate the completed piezoelectric devices from each other.

During manufacture of piezoelectric devices using the method summarized above, if any residual moisture or gas remains within the interior space between the lid and the package base, the moisture or gas adheres to the piezoelectric vibrating piece situated in the space. This residual moisture or gas tends to corrode the electrodes and/or cause an adverse effect on the oscillating characteristics of the piezoelectric vibrating piece. Conventional steps for removing residual gas and moisture are usually conducted during the anodic bonding step, which is performed in a vacuum chamber. The interior temperature of the vacuum chamber is first raised to a higher temperature required for degassing, followed by reduction to a lower temperature suitable for performing anodic bonding. Such a step consumes valuable manufacturing time and decreases manufacturing efficiency. If, in an effort to eliminate the temperature-change step to improve efficiency, the anodic bonding were conducted at the higher temperature, the different coefficients of thermal expansion of the crystal material of the piezoelectric vibrating piece and of the glass material of the lid and package base would cause fracture of the piezoelectric devices.

One approach for solving this problem is discussed in Japan Unexamined Patent Application No. 2004-254238. Specifically, piezoelectric vibrating devices are manufactured individually. Each piezoelectric vibrating device comprises a base plate on which the piezoelectric vibrating piece is attached, a package base, and a lid. The package base and lid are affixed to the base plate, wherein the base plate is sandwiched between the package base and lid.

A through-hole is formed in the center of either the package base or the lid. During manufacture of the piezoelectric device the lid, the base plate, and the package base are bonded together by anodic bonding performed under atmospheric conditions. Then, annealing is performed by heating the devices to a temperature higher than would be required for reflow.

To remove residual gas and/or moisture in the interior space of the package between the package base and lid, the package is placed in a vacuum chamber in which the interior space of the package is evacuated via the through-hole to establish the desired vacuum level in the interior space. Then, while maintaining the vacuum condition, a unit of sealing material is placed on the through-hole and a laser light is irradiated onto the sealing material to melt it sufficiently to flow into and seal the through-hole.

A conventional piezoelectric device comprises at least one external electrode on the lower (external) surface of the package base. Whenever such a piezoelectric device is mounted on a printed substrate, the external electrode(s) on the lower surface of the package base are placed on corresponding soldered mounting pad(s) of the printed substrate. A technician manipulates the package as required so that the package base of the piezoelectric device faces and registers with the soldered mounting pad(s).

Although the through-holes of piezoelectric devices discussed in the JP '238 reference are sealed, on an assembly line the through-holes may not be sealed completely due to imperfect melting and/or flow of the sealing material. Also, because the through-holes are formed at the center of the lid, the lid must be made of glass to allow transmission therethrough of a trimming laser beam. The beam passing through the glass irradiates certain metal regions of the vibrating arms of the piezoelectric vibrating piece. The beam ablates material from the metal regions as required to adjust the vibration frequency of the vibrating piece inside the package.

SUMMARY

The current invention solves the problems summarized above by providing, inter alia, piezoelectric vibrating devices that can be mounted on a printed base, regardless of which surface of the package is facing upward or downward, while also allowing through-holes of the devices to be sealed readily and reliably. Thus, additional steps that otherwise would be required to form holes used for frequency adjustment or other through-holes are reduced. During formation of through-holes, this invention reduces variations in hole diameters, which reduces the time required for vacuum sealing of the through-holes.

According to a first aspect, piezoelectric devices are provided. An embodiment of such a device comprises a piezoelectric frame to which is connected a tuning-fork type piezoelectric vibrating piece having a pair of vibrating arms. The frame has first and second major surfaces. The device also includes a lid having an inner major surface bonded to the first major surface of the piezoelectric frame. The lid defines a respective frequency-adjustment hole for each vibrating arm. The frequency-adjustment hole extends through the thickness dimension of the lid from the inner major surface (facing the piezoelectric frame) to the outer major surface. The device also includes a package base having an inner major surface bonded to the second major surface of the piezoelectric frame. The package base defines at least one electrode through-hole extending through the thickness dimension of the base from the inner major surface (facing the piezoelectric frame) to the outer major surface. Extending through the electrode through-hole is a respective electrode connected to a respective electrode on the tuning-fork type piezoelectric vibrating piece. The device also comprises at least one external electrode made of a conductive material. The external electrode, connected to the respective electrode passing through the respective electrode through-hole, is situated on the lid and package base so as to cover the through-holes and seal the frequency-adjustment holes. By sealing the electrode through-hole(s) as well as the frequency-adjustment hole(s) using respective external electrode(s), the piezoelectric device is completely sealed in one step, thereby reducing manufacturing time. Also, by configuring the external electrode(s) in this manner, the piezoelectric devices can be mounted without distinction of top versus bottom of the package. That is, the piezoelectric device can be mounted facing up or down, which eliminates a manipulation step and saves manufacturing time.

The frequency adjustment hole(s) desirably are formed on the lid at respective locations corresponding to the locations of the respective distal ends of the vibrating arms. The distal ends include respective frequency-adjustment portions made of metal films. Irradiation of a laser beam onto a frequency-adjustment portion removes, by laser ablation, some of the material of the frequency-adjustment portions, which produces corresponding changes in the vibration frequency of the piezoelectric device. Usually, the frequency-adjustment portions on both vibrating arms are trimmed in this way. Since the frequency-adjustment holes are formed at respective locations corresponding to the distal ends of respective vibrating arms, the laser beam can be irradiated via the frequency-adjustment holes to remove desired portions of the metal film of both frequency-adjustment portions to achieve a desired change in vibration frequency. For this purpose, the lid can be made of glass or other suitably transparent material, but application of a vacuum to the interior of the package can be achieved more easily via the frequency-adjustment holes, which eliminates any necessity to form and use separate evacuation holes.

A respective frequency-adjustment hole desirably is provided for each vibrating arm. Hence, devices having two vibrating arms comprise a corresponding pair of frequency-adjustment holes, one for each arm. Each frequency-adjustment hole is situated adjacent the frequency-adjustment portion of the respective vibrating arm. Thus, a laser beam being used to produce frequency adjustments can be directed through each frequency-adjustment hole to the respective frequency-adjustment portions to remove metal therefrom and adjust the vibration frequency.

The frequency-adjustment hole(s) and electrode through-hole(s) are desirably formed by machine processing and wet etching. This scheme reduces the number of steps required to form these holes and reduces the variations of hole diameters that would otherwise be produced by other techniques. Machine processing can be any one or more of sandblasting, laser ablation, ultrasonic machining, and drill machining. By forming at least respective portions of the frequency-adjustment holes and through-holes by machine processing, etching anisotropy is not a factor. Consequently, frequency-adjustment holes and electrode through-holes can be easily formed having the desired shape and size. Furthermore, machine processing consumes less time than wet etching, which reduces overall manufacturing time.

The respective portion of each frequency-adjustment hole that is formed by machine processing desirably extends from the outer major surface of the lid, i.e., from the major surface opposite the major surface facing the piezoelectric frame, into the thickness dimension of the lid. The remaining portion of the frequency-adjustment hole is formed by wet etching from the inner major surface of the lid, i.e., from the major surface facing the piezoelectric frame. The two hole portions are contiguous, thereby providing holes that pass completely through the thickness of the lid.

Similarly, a respective portion of each electrode through-hole is formed, by machine processing, from the outer major surface of the package base into the thickness dimension of package base, i.e., from the major surface opposite the major surface facing the piezoelectric frame. The remaining portion of the electrode through-hole is formed by wet etching from the inner major surface of the package base, i.e., from the major surface facing the piezoelectric frame. The two hole portions are contiguous, thereby providing holes that pass completely through the thickness of the package base.

The frequency-adjustment holes and/or electrode through-holes can be sealed using sealing material (eutectic metal). A respective unit of the eutectic metal is placed on each respective hole and melted to flow into the respective hole. The holes are configured depthwise to control the flow of eutectic and prevent incursion of molten eutectic into the interior of the package. In certain embodiments, each frequency-adjustment hole has a first portion extending from the outer major surface of the lid to a "connecting point" located at a predetermined location in the thickness dimension of the lid, and a second portion extending from the inner major surface of the lid to the connecting point. At the connecting point, the two portions are contiguous. By way of example, the first portion has a greater "diameter" (transverse section) than the diameter of the second portion. This and other hole-depth configurations disclosed herein prevent molten sealing material from flowing into the interior of the piezoelectric device, while still sealing the respective holes. Machine processing normally can produce larger hole diameters than wet etching. Therefore, a desired hole diameter and shape on the outer major surface can be obtained by performing machine processing on the outer major surface of the lid or package base. On the other hand, hole portions on the inner major surface of the lid or package base desirably are formed by wet etching because wet etching can form holes easily on surfaces where holes are otherwise difficult to form. Machine processing also tends to be more accurate and precise for forming holes, compared to wet etching. Thus, variability of hole shape can be minimized in production so that consistent sealing results are obtained using the sealing material (eutectic material).

In some embodiments the transverse section ("diameter") of each frequency-adjustment hole progressively decreases with distance, in the thickness dimension, from the outer major surface to the inner major surface of the lid. This configuration, desirably achieved by machine processing, effectively prevents incursion of molten sealing material (eutectic metal) into the interior of the piezoelectric device, allowing for reliable sealing being performed during a sealing step.

In some embodiments each electrode through-hole has a first portion and a second portion that meet at a connecting point in the thickness dimension of the package base. In the first portion, desirably formed by machine processing, the transverse section ("diameter") progressively decreases with distance, in the thickness dimension, from the outer major surface to the connecting point. In the second portion, desirably formed by wet etching, the transverse section progressively decreases with distance, in the thickness dimension, from the inner major surface to the connecting point. This configuration prevents molten sealing material (eutectic metal) from flowing into the interior of the piezoelectric device.

After adjusting the vibration frequency of the vibrating arms using a laser beam illuminated through the frequency-adjustment holes, the interior of the piezoelectric device desirably is evacuated by application of vacuum, which evacuates the interior of the device via the frequency-adjustment holes. Thus, the vibration frequency is adjusted in a manner allowing removal of gaseous material, existing within the piezoelectric device, readily by apertures that allow rapid evacuation. Also, metal evaporated by the laser beam from the frequency-adjustment portions can be evacuated via the frequency-adjustment holes, especially if the holes have sufficient diameter. In any event, this manner of evacuating metal residue, moisture, and gases from the interior of the piezoelectric device is effective.

Irradiation of the laser beam through the frequency-adjustment holes can be performed during vacuum evacuation of the interior of the piezoelectric device. This removes ablated debris and gases as they are being formed, which prevents adhesion of these laser-ablation by-products to the piezoelectric vibrating piece and/or to other locations inside the piezoelectric device. As a result, adverse affects to the piezoelectric device caused by remaining metal, moisture, and gases are prevented.

According to certain embodiments, manufacturing steps for forming frequency-adjustment holes and electrode through-holes are reduced by using both machine processing and wet etching. These techniques reduce the variability of hole diameters and configurations obtained with conventional methods, and reduce evacuation time.

Piezoelectric vibrating devices as disclosed herein do not need to be mounted such that a particular surface is always facing upward, for example. Rather, the devices can be mounted either top-side up or bottom-side up. This eliminates a manipulation step.

BRIEF DESCRIPTION OF THE DRAWINGS

FIG. 1A is a plan view of the lower major surface (i.e., the inner major surface) of a lid of a first embodiment of a piezoelectric vibrating device.

FIG. 1B is a plan view of the upper major surface of a piezoelectric frame of the first embodiment, the frame surrounding an integral piezoelectric vibrating piece.

FIG. 1C is a plan view of the upper major surface (i.e., the inner major surface) of a package base of the first embodiment.

FIG. 1D is an elevational section of the first embodiment of a piezoelectric vibrating device, along the line A-A in FIGS. 1A, 1B, and 1C.

DETAILED DESCRIPTION

Figure 2A:
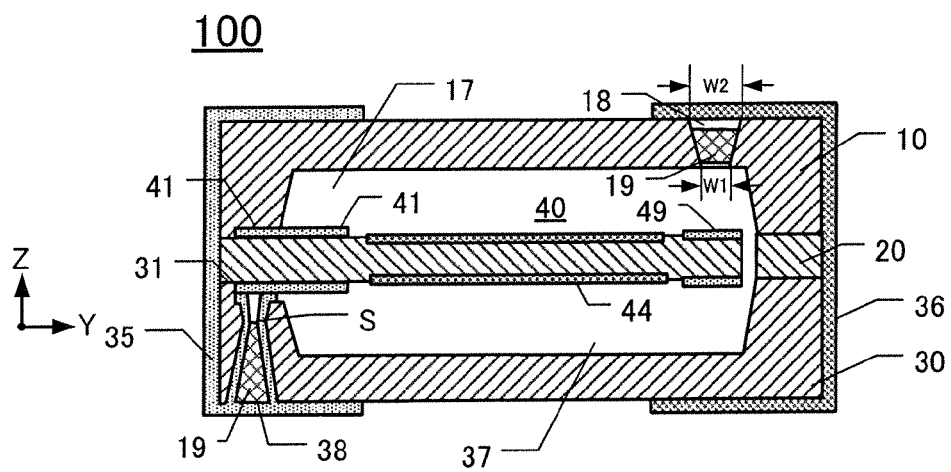
FIG. 2A is an elevational section of the first embodiment, along the line D-D in FIG. 1B, wherein the lid, piezoelectric frame, and package base 30 are bonded together by siloxane bonding.

The present invention is described with reference to the accompanying figures. It will be understood that the invention is not limited by the figures.

First Embodiment of Piezoelectric Vibrating Device

Relevant details of this embodiment of a piezoelectric vibrating device 100 are depicted in FIGS. 1A-1D. FIG. 1A is a plan view of the inner major surface of a lid 10 of the device 100. FIG. 1B is a plan view of the upper major surface of a "piezoelectric frame" 20 including a piezoelectric vibrating piece 40. FIG. 1C is a plan view of the inner major surface of a package base 30 of the device 100. FIG. 1D is an elevational section along the line A-A of FIGS. 1A-1C. Note that the "piezoelectric vibrating device" of this embodiment comprises the piezoelectric frame 20 (including the piezoelectric vibrating piece 40) sandwiched between the lid 10 and package base 30. Thus, the lid 10, frame 20, and package base 30 collectively form a "package" enclosing the piezoelectric vibrating piece 40 in a space inside the package. To facilitate comprehension of relevant details, a first external electrode 35 and a second external electrode 36 (see FIGS. 2A and 2B) are not shown in FIGS. 1A-1D.

Turning first to FIG. 1A, the lid 10 has a concavity 17 formed by etching of the inner major surface of the lid 10. In view of the depicted major surface being the inner major surface, the concavity 17 faces the piezoelectric vibrating piece 40 in the assembled package. As shown in FIG. 1D, the lid 10 defines a pair of frequency-adjustment holes 18, which are respective through-holes located at positions corresponding to the locations of respective "frequency-adjustment portions" 49 of the piezoelectric vibrating piece 40 of FIG. 1B. In this embodiment the frequency-adjustment portions 49 are located on the distal ends of the vibrating arms 46. The frequency-adjustment holes 18 desirably are formed by machine processing, such as sandblasting, laser ablation, ultrasonic machining, drill machining, or other suitable technique. Each frequency-adjustment hole 18 has a circular or oval profile (FIG. 1A).

Turning to FIG. 1B, the piezoelectric frame 20 comprises the piezoelectric vibrating piece 40 and an outer frame portion 29 surrounding the piezoelectric vibrating piece 40. The piezoelectric vibrating piece 40 is configured as a very small crystal (e.g., quartz) tuning fork that, when electrically energized, oscillates at 32.768 kHz, for example. The piezoelectric vibrating piece 40 comprises a base portion 45. A pair of vibrating arms 46 extends from the base portion 45 in a designated direction (Y-direction in the figure). Laterally outboard (in the X-direction in the figure) of each vibrating arm 46 is a respective supporting arm 47 that extends (in the X-direction) from the base portion 45 and then extends in the Y-direction parallel to the respective vibrating arm 46. At the distal end of each vibrating arm 46 is a respective frequency-adjustment portion 49. Each vibrating arm 46 also has a respective excitation electrode 43, 44 formed on the upper, lower, and side surfaces of the vibrating arm 46 by vacuum deposition or sputtering. (The excitation electrodes are referred to herein as a "first" excitation electrode 43 on one of the vibrating arms 46 and a "second" excitation electrode 44 on the other of the vibrating arms 46.) Each frequency-adjustment portion 49 comprises a metal film formed by vacuum deposition or sputtering. Each such metal film is connected to the respective first excitation electrode 43 or second excitation electrode 44 on the side surface of the respective vibrating arm 46.

A first base electrode 41 and a second base electrode 42 are formed on the base portion 45 and on the supporting arms 47 by vacuum deposition or sputtering. The first base electrode 41 is connected to the first excitation electrode 43, and the second base electrode 42 is connected to the second excitation electrode 44.

The first base electrode 41, second base electrode 42, first excitation electrode 43, and second excitation electrode 44 each comprise a gold (Au) layer (400 to 2000 Ångstroms thickness) on a foundation layer (150 to 700 Ångstroms thickness) of chromium (Cr). Instead of chromium, nickel (Ni) or titanium (Ti) can be used. Also, instead of gold, silver (Ag) can be used. Further alternatively, instead of the Au—Cr double-layer configuration, better adhesion, corrosion-resistance, electrical conductivity, and heat-resistance may be achieved by forming these electrodes of an alloy of copper (Cu, as a main component) and aluminum (Al).

As noted, the supporting arms 47 extend from respective sides of the base portion 45 and then extend parallel to the vibrating arms 46 in the Y-direction. Each supporting arm 47 is connected to the outer frame portion 29 by a respective connecting portion 48. The supporting arms 47 reduce leakage of oscillation from the vibrating arms 46 to outside the piezoelectric vibrating device 100, and also reduce adverse effects of external temperature changes or dropping impacts.

Turning to FIG. 1C, the inner major surface of the package base 30 has a concavity 37 formed by etching. The concavity 37 faces the piezoelectric vibrating piece 40. Also, on respective corners (diagonally opposing corners in the figure) of the inner major surface of the package base 30 are respective depressions (formed by wet-etching) located to coincide with (and thus to connect to) the distal end of the first base electrode 41 and the distal end of the second base electrode 42, respectively. The depression connected to the first base electrode 41 is also connected to the first connecting electrode 31, and the depression connected to the second base electrode 42 is also connected to the second connecting electrode 32. A respective electrode through-hole is formed at each depression. More specifically, a first electrode through-hole 38 is located in the first depression (thereby to connect with the first connecting electrode 31), and a second electrode through-hole 39 is located in the second depression (thereby to connect with the second connecting electrode 32). The electrode through-holes desirably are formed using both machine processing and wet etching.

Figure 2B:
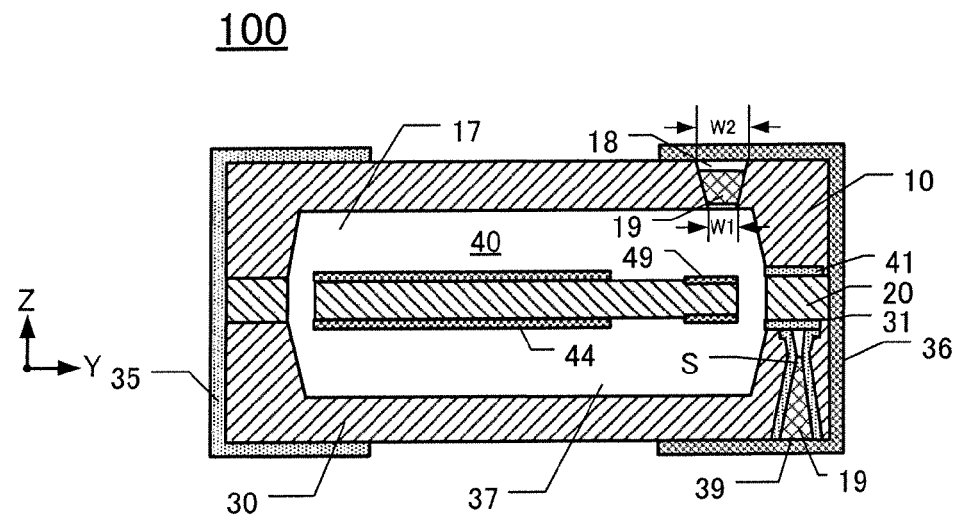
FIG. 2B is an elevational section of the first embodiment, along the line E-E in FIG. 1B.

Each electrode through-hole 38, 39 includes a metal film formed on the inner surfaces of the hole. The metal film can be formed by photolithography when the first and second connecting electrodes 31 and 32 are being formed. This metal film desirably comprises a gold (Au) layer or silver (Ag) layer on a foundation layer made of chromium (Cr) or nickel (Ni). Via the metal film on the inner surfaces of the electrode through-holes 38, 39, the first connecting electrode 31 is connected to a first external electrode 35 (see FIGS. 2A and 2B), and the second connecting electrode 32 is connected to a second external electrode 36 (FIGS. 2A and 2B). Thus, each of these metal films is a respective "through-hole electrode."

As shown in FIG. 1D, the piezoelectric frame 20 is sandwiched between the lid 10 and the package base 30. The lid 10 and package base 30 are bonded to the frame 20 by siloxane bonding that also achieves bonding (and thus electrical connection) of respective base electrodes, connecting electrodes, through-hole electrodes, and external electrodes with each other.

FIG. 2A is an elevational section, along the line D-D of FIG. 1B, of this embodiment of a piezoelectric vibrating device 100, in which the lid 10, piezoelectric frame 20, and package base 30 are bonded together by siloxane bonding. FIG. 2B is an elevational section along the line E-E of FIG. 1B. In FIGS. 2A and 2B, the first external electrode 35 and the second external electrode 36 (not shown in FIG. 1D) are shown. The frequency-adjustment hole 18, defined in the lid 10, has X- and Y-coordinates that coincide with the X- and Y-coordinates of the respective frequency-adjustment portion 49; thus, the frequency-adjustment hole 18 is located above (in the Z-direction) the respective frequency-adjustment portion 49. If the diameter of the frequency-adjustment hole 18 on the inner major surface of the lid facing the piezoelectric vibrating piece 40 is denoted W1 and the diameter off the frequency-adjustment hole 18 on the outer major surface of the lid 10 is denoted W2, it is desirable that W2>W1. To seal the through-hole 18 after completing formation of the package, a unit of sealing material 19 (desirably a eutectic metal) is placed on the frequency-adjustment hole 18 and melted to flow into the through-hole. By configuring W2>W1, undesired flow of melted sealing material 19 into the interior of the package is prevented.

Referring further to FIGS. 2A and 2B, the diameter (in the Y-direction) of the first electrode through-hole 38 progressively decreases, with increasing distance (in the −Z-direction) from the inner major surface facing the piezoelectric frame 20, to a "connecting point" S located in the thickness dimension of the package base 30. With further distance (in the −Z-direction) from the connecting point S, the diameter progressively increases to the outer major surface of the package base 30. Thus, the connecting point S represents the Z-coordinate at which the respective electrode through-hole has minimum diameter. The second electrode through-hole 39 (shown in FIG. 2B) has the same sectional profile as that shown in FIG. 2A for the first electrode through-hole 38. To seal the electrode through-holes 38, 39, respective units of sealing material 19 are placed on the outer openings of the through-holes and melted to allow the sealing material 19 to flow into the electrode through-holes 38, 39. Flow generally progresses to the connecting points S and no further. By configuring the electrode through-holes in the manner shown, undesired flow of the melted sealing material 19 into the interior of the package is reliably prevented.

The electrode through-holes 38, 39 are configured as described above desirably by a combination of machine processing and wet etching. Example machine-processing techniques include sandblasting, laser ablation, ultrasonic machining, and drill machining. In the conventional method of forming through-holes by wet etching, the diameter of the hole at the location where etching commences is different from the diameter of the hole at the location where etching is halted, due to crystal anisotropy. As a result, the hole may become unnecessarily large. Also, whenever crystal material is being wet etched, as etching progresses and the hole deepens, the transverse-sectional area of the hole becomes smaller, which progressively inhibits good flow of the etchant to the surfaces to be etched. Consequently, etch rate tends to be slower and more varied with increased depth, which yields unacceptable variability of hole diameters. By using a combination of machine processing and wet etching, these problems are prevented.

After the lid 10, the piezoelectric frame 20, and the package base 30 are bonded together by siloxane bonding, the interior cavity defined at least in part by the concavities 17, 37 of the lid and the base is evacuated by application of vacuum. As shown in FIGS. 2A and 2B, the first external electrode 35 and second external electrode 36 made of a piezoelectric material are formed on the lid 10, the piezoelectric frame 20, and the package base 30 so as to cover the first electrode through-hole 38, the second electrode through-hole 39 (see FIG. 1C), and the sealed frequency-adjustment holes 18.

The first and second external electrodes 35, 36 are formed on the lid 10, the piezoelectric frame 20, and the package base 30 in the depicted manner so that the piezoelectric device 100 can be mounted by either its top or bottom surface on a circuit board or the like. By providing mountability of the device without distinction of its top or bottom surface, the efficiency by which devices including this piezoelectric vibrating device 100 can be manufactured is substantially improved. Also, the first and second external electrodes 35, 36 are configured so as to cover the first electrode through-hole 38, the second electrode through-hole 39 (FIG. 1C) and the frequency-adjustment holes 18. The resulting consistency by which these holes are sealed eliminates otherwise possible seal failures of the piezoelectric vibrating device 100.

Method for Manufacturing Piezoelectric Vibrating Devices

Figure 3:
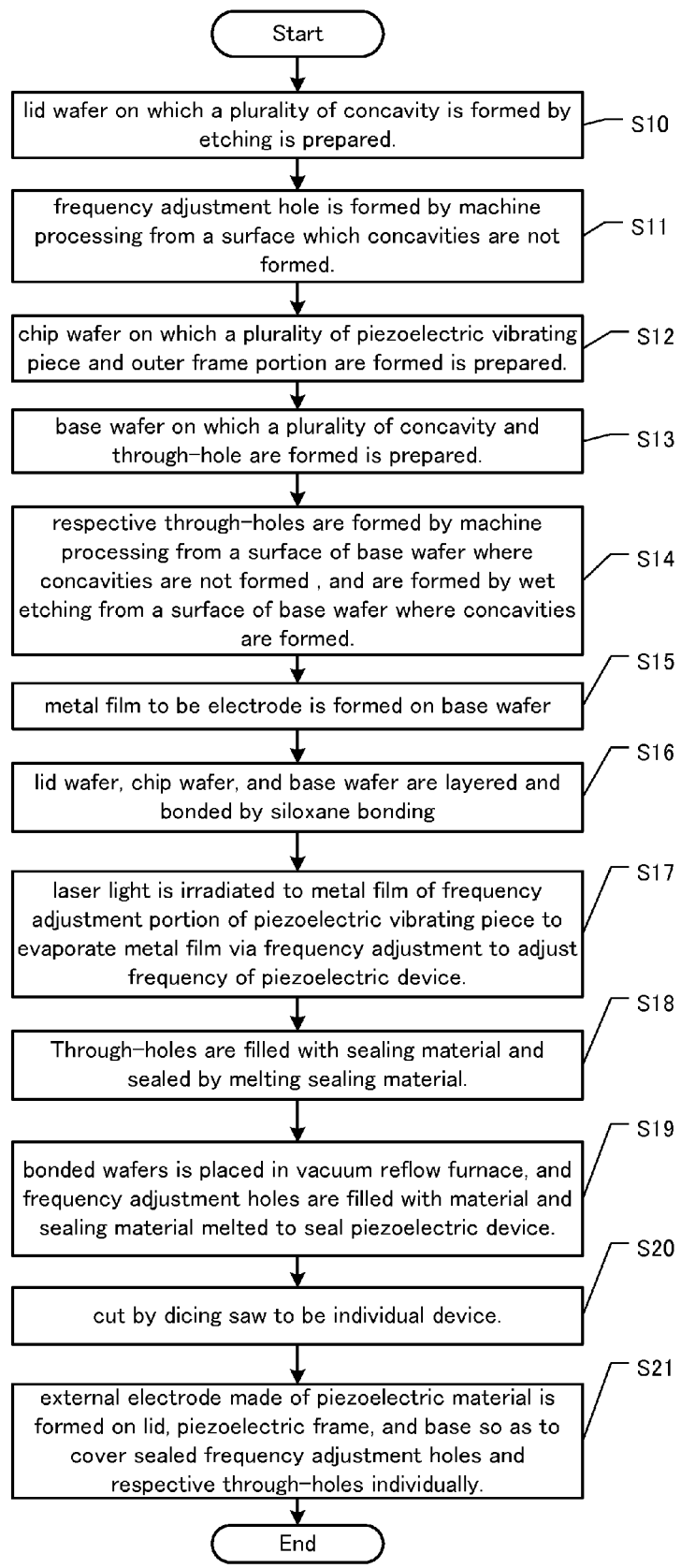
FIG. 3 is a flow-chart of an embodiment of a method for manufacturing a piezoelectric vibrating device according to the first embodiment.

FIG. 3 is a flow chart of this embodiment of a method for manufacturing the piezoelectric vibrating device 100 described above. Although, in FIGS. 1D, 2A, and 2B, only one piezoelectric vibrating device is depicted for simplicity of description thereof, in an actual manufacturing process hundreds or thousands of lids 10, piezoelectric frames 20, and package bases are foamed on a lid wafer LW, a chip wafer VW, and a base wafer BW, respectively. The wafers are superposed in registration with each other (with the chip wafer VW sandwiched between the lid wafer LW and base wafer BW) and bonded together to produce hundreds or thousands of piezoelectric devices 100 simultaneously.

This embodiment of a manufacturing method includes the following steps:

Step S10: A lid wafer LW is prepared. The lid wafer is made from a Z-cut crystal wafer and defines a plurality of lids 10 each having a concavity 17 formed by etching.

Step S11: At respective X,Y locations corresponding to the X,Y coordinates of the frequency-adjustment portions 49 on the vibrating arms of the piezoelectric vibrating piece 40, frequency-adjustment holes 18 penetrating the lid 10 are formed by machine processing (e.g., sand-blasting) from the outer major surface of the lid. By machining from the major surface opposite the concavity 17, the frequency-adjustment holes 18 are formed having progressively narrower transverse profiles with increasing depth, wherein the transverse profiles are narrowest where the holes open onto the surface of the concavity 17. Alternatively to sand-blasting, the frequency-adjustment holes 18 can be formed by laser ablation, ultrasonic machining, or drill machining.

Step S12: A chip wafer VW is prepared. The chip wafer is made from a Z-cut crystal wafer and defines a plurality of piezoelectric frames 20 each comprising a piezoelectric vibrating piece 40 and an outer frame portion 29 formed by etching. Conventional techniques are used to form the piezoelectric frames. Each piezoelectric frame 20 also includes a base portion 45, supporting arms 47, a first base electrode 41, a second base electrode 42, a first excitation electrode 43, and a second excitation electrode 44.

Step S13: A base wafer BW is prepared. The base wafer is made from a Z-cut crystal wafer and defines a plurality of bases 30 each comprising a concavity 37 formed by etching.

Step S14: Electrode through-holes 38, 39 (also called "connecting through-holes") are formed in the base wafer BW. First, using a sand-blasting technique (as an exemplary machine processing technique), respective holes are formed on the outer major surface of the base wafer. (The outer major surface is opposite the inner major surface in which the concavity 37 is defined.) These holes extend into the thickness dimension (Z-direction) of the base wafer to a depth S. Then, using wet-etching, corresponding holes are formed on the inner major surface of the base wafer that extend to the depth S and connect with the respective holes formed earlier in this step, thereby forming the electrode through-holes 38, 39 that extend fully through the thickness of the base wafer. Alternatively to sand blasting, holes may be formed by laser ablation, ultrasonic machining, or drill machining. Performance of this step produces electrode through-holes of which the diametric profile exhibits a change at the depth S (see FIGS. 2A and 2B). By performing this step, the first and second electrode through-holes 38, 39 have different diameters on respective major surfaces of the base wafer. This step desirably is performed using both a machine process and wet-etching to form the through-holes, thereby avoiding problems in hole configurations otherwise caused by anisotropy of the crystal material.

Step S15: A metal film is formed on the base wafer BW. This metal film is configured to be the first and second connecting electrodes 31, 32 as well as the inner conductors of the first and second electrode through-holes 38, 39.

Step S16: The lid wafer LW, the chip wafer VW, and the base wafer BW are superposed in registration with each layer to form a sandwich of the chip wafer between the lid and base wafers. The wafers are bonded together by siloxane bonding. To perform siloxane bonding, respective bonding surfaces of each wafer are "mirrored" (polished to a mirror finish), and the mirrored surfaces are activated by exposure to a plasma or irradiating ion beam. By way of example, each wafer is four inches in diameter and has a respective orientation flat. Thus, the three wafers can be aligned together accurately and correctly. After forming the sandwich, it is heated to within the range of 100° C. to 200° C. with application of suitable pressure in a normal air atmosphere. The resulting siloxane bonding that occurs under these conditions bonds the wafers strongly together.

Step S17: The vibration frequency of the piezoelectric vibrating device is adjusted (as required) by irradiating a laser beam through each of the frequency-adjustment holes 18 onto the respective frequency-adjustment portions 49. The laser beam thus ablates a desired portion of the metal layer constituting each frequency-adjustment portion. The resulting removal of mass from the distal ends of the vibrating arms causes a corresponding change (typically an increase) of the vibration frequency of the vibrating arms of the piezoelectric vibrating piece 40.

Step S18: The siloxane-bonded wafer (piezoelectric device 100) is placed upside-down. A unit of sealing material 19 (a eutectic metal alloy of gold and germanium ($Au_{12}Ge$)) is placed on each of the now upward-facing electrode through-holes 38, 39. The sealing material 19 is heated in a furnace (temperature approximately 350° C.) or irradiated by laser light to commence melting of the sealing material 19. Then, in each electrode through-hole 38, 39 the molten sealing material 19 is pressed using a tool. Flow of the molten sealing material is facilitated by the presence of metal film on the inner surfaces of the electrode through-holes 38, 39. In this case, the volume of molten sealing material 19 entering each electrode through-hole 38, 39 desirably is less than the volume of the respective through-hole.

Step S19: The bonded wafer, which had been oriented upside-down, is turned over so that the up-side faces upward. The bonded wafer is placed in a vacuum-reflow furnace. As vacuum is applied, gas inside each package is evacuated via the frequency-adjustment holes 18 and the interior of each package reaches a desired vacuum state. Thus, the frequency-adjustment holes 18 act as evacuation holes. In a conventional process, the cavity in the package in which the piezoelectric vibrating piece 40 is situated is evacuated by drawing gas from spaces between the bonded piezoelectric frame 20, the first electrode through-hole 38, and the second electrode through-hole 39. However, this conventional process takes time because the air must be drawn from spaces between bonded wafers; also, this conventional technique may result in failure to reach a desired vacuum state inside the package. In this embodiment, because the frequency-adjustment holes 18 are used as both frequency-adjustment holes and evacuation holes, the space inside the package accommodating the piezoelectric vibrating piece 40 can be evacuated more easily, more completely, and in less time than conventionally. Next, in a vacuum reflow furnace, respective units of sealing material 19 (comprising a eutectic mixture of gold and germanium, $Au_{12}Ge$) are placed on the frequency-adjustment holes 18. The temperature of the reflow furnace is approximately 350° C. Alternatively, a laser beam can be made incident on the units of sealing material 19. In either event, the sealing material 19 is melted. The molten sealing material 19 can be urged, using a tool, into the respective holes 18 to seal the holes. Desirably, the volume of each unit of sealing material 19 is less than the volume of the respective frequency-adjustment hole 18. The sealing material 19 is not limited to $Au_{12}Ge$ eutectic; an alternative sealing material 19 is a low-melting-point material such as glass resin.

Step S20: After completion of steps S10-S19, the bonded wafer is cut, using a dicing saw, to separate the individual devices from each other.

Step S21: First and second external electrodes 35, 36, each made of an electrically conductive material, are formed over the lid 10, piezoelectric frame 20, and package base 30 of each device to cover and further seal the frequency-adjustment holes 18 and first and second electrode through-holes 38, 39.

By way of example, the opening diameter of each frequency-adjustment hole 18 on the outer major surface of the lid 10 is Φ5 to Φ10 µm. In this embodiment, the frequency-adjustment holes 18 are formed on a lid having no previously formed openings; alternatively, these holes can be formed on a lid having previously formed openings.

In this embodiment, the electrode through-holes 38, 39 are sealed with material of the first and second electrodes 35, 36 after performing vibration-frequency adjustment, followed by sealing of the frequency-adjustment holes 18 in a vacuum environment to complete fabrication of the piezoelectric device. Alternatively, vibration frequency can be adjusted after the electrode through-holes 38, 39 have been sealed, followed by sealing of the frequency-adjustment holes 18. Further alternatively, after adjusting the vibration frequency, the electrode through-holes 38, 39 and frequency-adjustment holes 18 can be sealed to complete the piezoelectric device.

Second Embodiment of Piezoelectric Vibrating Device

Figure 4:
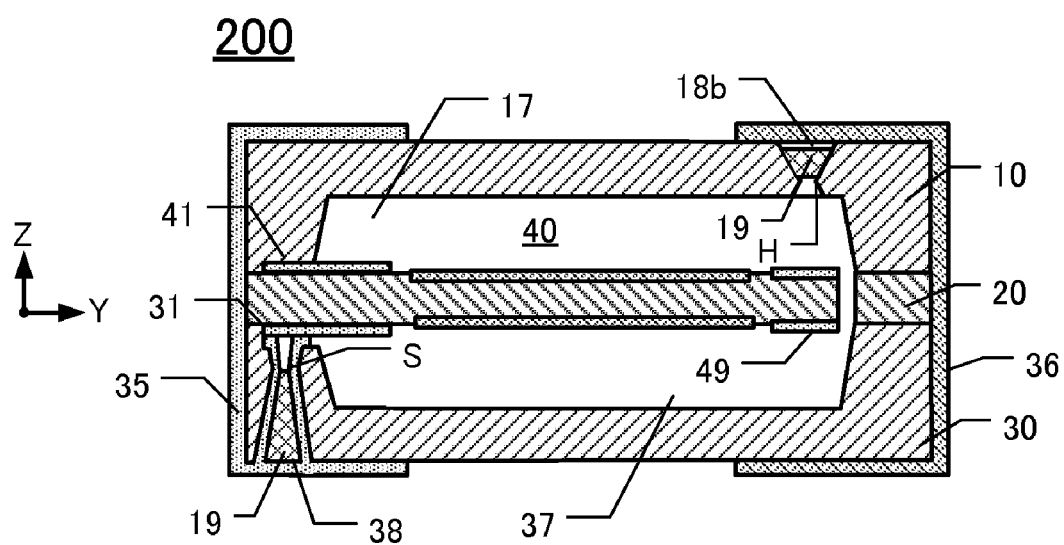
FIG. 4 is a simplified elevational section of a second embodiment of a piezoelectric vibrating device.

This embodiment 200 is shown in FIG. 4, which is a simplified elevational section of the subject piezoelectric vibrating device. Only the differences from the first embodiment 100 are described below. The second embodiment 200 has almost the same configuration as the first embodiment 100, except that, in the second embodiment the elevational sectional profile of the frequency-adjustment holes 18b is similar to the elevational sectional profile of the electrode through-hole 38. I.e., the diameter of the frequency-adjustment hole 18b progressively narrows with increased depth from both major surfaces. The progressions change at the connecting point H.

As the frequency-adjustment holes 18b are being formed, a first portion of each hole formed by machine processing (e.g., sand-blasting) from the outer major surface of the lid 10 into the thickness dimension of the lid. Machining is stopped at the connecting point H to avoid having the machined hole penetrate fully through the thickness dimension of the lid. Then, a corresponding second hole portion is formed from the inner major surface of the lid 10 (i.e., the major surface including the concavity 17) to connect at the connecting point to the hole portion extending from the outer major surface. Thus, frequency-adjustment holes 18b are formed that extend fully through the thickness dimension of the lid 10.

Each frequency-adjustment hole 18b also progressively narrows with increasing depth, to the connecting point H, from the inner major surface of the lid (i.e., from the surface of the lid facing the piezoelectric frame 20), as shown in FIG. 4. Thus, the hole 18b is wider at the inner major surface than at the connecting point H. When the frequency-adjustment holes 18b are being filled and sealed with molten sealing material 19, full penetration of the sealing material to the interior of the piezoelectric vibrating device 200 is prevented by the progressive narrowing and constriction at the connecting point.

A method for manufacturing the second embodiment of a piezoelectric vibrating device 200 is almost the same as the method for manufacturing the first embodiment 100. The differences are in steps S17, S18, and S19 shown in FIG. 3. Namely, in the method for manufacturing the second embodiment, after Step S16, siloxane-bonded wafers are placed in a vacuum-reflow furnace. Then, residual gas inside the piezoelectric vibrating device 200 is evacuated via the frequency-adjustment holes 18b and first and second electrode through-holes 38, 39 to establish a desired vacuum state inside the packages. The frequency-adjustment holes 18b and first and second electrode through-holes 38, 39 act as evacuation holes. After evacuation, but still within the reflow furnace, a laser beam is irradiated onto the frequency-adjustment portions 49 of the piezoelectric vibrating piece 40 via the frequency-adjustment holes 18b to evaporate metal from these portions as required to adjust the vibration frequency of the vibrating arms. Meanwhile, the metal released from the frequency-adjustment portion 49 by the laser remains evaporated in the vacuum-reflow furnace, which allows the evaporated metal (as well as moisture and other gases) to be evacuated via the frequency-adjustment holes 18b before these by-products can adhere to the piezoelectric vibrating piece 40. In this manner, otherwise adverse effects of evaporated metal or moisture deposited on the piezoelectric vibrating piece are avoided. Next, units of the sealing material 19 are placed on the first and second electrode through-holes 38, 39, and the sealing material 19 is melted by heating or laser irradiation to seal the through-holes. Afterward, respective units of the sealing material 19 are placed on the frequency-adjustment holes 18b and melted by heating or laser irradiation to complete fabrication of the second embodiment 200 of a piezoelectric vibrating device.

Figure 5:
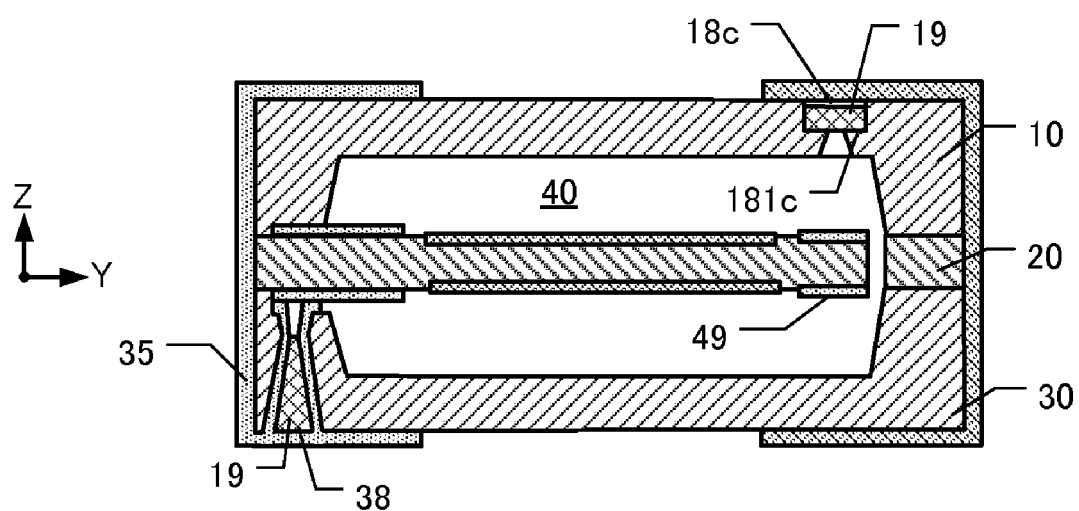
FIG. 5 is a simplified elevational view of an alternative embodiment of a piezoelectric vibrating device, comprising a frequency-adjustment hole in the lid.

FIG. 5 is an elevational section showing an alternative example of a frequency-adjustment hole. The frequency-adjustment hole 18c of FIG. 5 includes a tier 181c within the hole for preventing incursion of molten sealing material 19 (see FIG. 4) into the interior of the piezoelectric vibrating device. The frequency-adjustment hole 18c can be formed by the same steps used for forming the frequency-adjustment hole 18b in the embodiment shown in FIG. 4. A first portion of the hole 18c is formed, by machine processing, from the outer major surface of the lid. A second portion of the hole 18c is formed, by wet etching, from the inner major surface of the lid. By forming the two portions of each frequency-adjustment hole 18c at the same respective X,Y coordinates, the two hole portions form a respective through-hole (frequency-adjustment hole 18c) that extends fully through the thickness dimension of the lid.

The respective frequency-adjustment holes and electrode through-holes in the embodiments described above have rectilinear or linearly angled interior sides as shown. Alternatively, the interior sides (or portions thereof) can be curved.

The invention has been described above in the context of preferred embodiments. It will be understood that those of ordinary skill in the art can vary and/or modify the invention within the scope of this invention.

What is claimed is:

1. A piezoelectric device, comprising:
   a piezoelectric frame comprising a frame portion and a tuning-fork type piezoelectric vibrating piece, including multiple vibrating arms and at least one electrode, surrounded by and attached to the frame portion, the piezoelectric frame including a first major surface and an opposing second major surface;
   a lid having a thickness, an outer major surface, and an opposing inner major surface, the inner major surface being bonded to the first major surface of the piezoelectric frame, the lid defining at least one frequency-adjustment hole passing through the thickness of the lid from the inner major surface to the outer major surface thereof;
   a package base having a thickness, an outer major surface, and an opposing inner major surface, the inner major surface being bonded to the second major surface of the piezoelectric frame, the package base defining at least one through-hole electrode passing via an electrode through-hole through the thickness of the package base from the inner major surface to the outer major surface thereof, the at least one through-hole electrode providing a respective electrical connection of the electrode on the tuning-fork type piezoelectric vibrating piece to outside the package base; and
   at least one external electrode made of an electrically conductive material, the external electrode being connected to a respective electrode in a respective electrode through-hole extending on both the lid and package base so as to cover the at least one electrode through-hole and the at least one frequency-adjustment hole.

2. The piezoelectric device of claim 1, wherein:
   each vibrating arm has a distal frequency-adjustment portion; and
   each frequency-adjustment hole has a respective location on the lid corresponding to the respective location of the frequency-adjustment portion of a respective vibrating arm.

3. The piezoelectric device of claim 1, wherein each frequency-adjustment hole has a diameter that progressively decreases with increased distance through the thickness of the lid from the outer major surface to the inner major surface of the lid.

4. The piezoelectric device of claim 1, wherein:
   each frequency-adjustment hole has a first portion and a second portion that is contiguous with the first portion;
   the first portion extends from the outer major surface of the package lid to a predetermined connecting point in the thickness of the lid; and
   the second portion extends from the inner major surface of the package lid to the connecting point; and
   at least one of the first and second portions has a diameter that progressively decreases with increased distance to the connecting point from the respective major surface.

5. The piezoelectric device of claim 4, wherein:
   the first portion of each frequency-adjustment hole has a diameter that progressively decreases with increased distance through the thickness from the outer major surface of the lid to the connecting point; and
   the second portion of each frequency-adjustment hole has a diameter that progressively decreases with increased distance through the thickness from the inner major surface to the connecting point.

6. The piezoelectric device of claim 1, wherein:
   each electrode through-hole has a first portion and a second portion that is contiguous with the first portion;
   the first portion extends from the outer major surface of the package base to a predetermined connecting point in the thickness of the package base;
   the second portion extends from the inner major surface of the package base to the connecting point; and
   at least one of the first and second portions has a diameter that progressively decreases with distance to the connecting point from the respective major surface.

7. The piezoelectric device of claim 6, wherein:
   the first portion of each electrode through-hole has a diameter that progressively decreases with increased distance through the thickness from the outer major surface to the connecting point; and
   the second portion of each electrode through-hole has a diameter that progressively decreases with distance through the thickness from the inner major surface to the connecting point.

8. The piezoelectric device of claim 6, wherein:
   each frequency-adjustment hole has a first portion and a second portion that is contiguous with the first portion;
   the first portion extends from the outer major surface of the package lid to a predetermined connecting point in the thickness of the lid;
   the second portion extends from the inner major surface of the package lid to the connecting point; and
   at least one of the first and second portions has a diameter that progressively decreases with increased distance to the connecting point from the respective major surface.

9. The piezoelectric device of claim 8, wherein:
   the first portion of each frequency-adjustment hole has a diameter that progressively decreases with increased distance through the thickness from the outer major surface to the connecting point; and the second portion of each frequency-adjustment hole has a diameter that progressively decreases with increased distance through the thickness from the inner major surface to the connecting point.

10. The piezoelectric device of claim 1, wherein each frequency-adjustment hole and each electrode through-hole has a respective first portion formed by machine processing and a respective second portion formed by wet-etching.

11. The piezoelectric device of claim 2, wherein each frequency-adjustment hole and each electrode through-hole has a respective first portion formed by machine processing and a respective second portion formed by wet-etching.

12. The piezoelectric device of claim 3, wherein each frequency-adjustment hole and each electrode through-hole has a respective first portion formed by machine processing and a respective second portion fotined by wet-etching.

13. The piezoelectric device of claim 5, wherein:
the first portion of each frequency-adjustment hole is formed by machine processing; and
the second portion of each frequency-adjustment hole is formed by wet-etching.

14. The piezoelectric device of claim 1, further comprising a seal in the at least one frequency-adjustment hole, the seal being formed after passing a laser beam through the frequency-adjustment hole to a respective vibrating arm as required to adjust a vibration frequency of the vibrating arm and after vacuum-evacuation of the package.

15. The piezoelectric device of claim 2, further comprising a seal in the at least one frequency-adjustment hole, the seal being formed after passing a laser beam through the frequency-adjustment hole to a respective vibrating arm as required to adjust a vibration frequency of the vibrating arm and after vacuum-evacuating the package.

16. The piezoelectric device of claim 3, further comprising a seal in the at least one frequency-adjustment hole, the seal being formed after passing a laser beam through the frequency-adjustment hole to a respective vibrating arm as required to adjust a vibration frequency of the vibrating arm and after vacuum-evacuating the package.

17. The piezoelectric device of claim 4, further comprising a seal in the at least one frequency-adjustment hole, the seal being formed after passing a laser beam through the frequency-adjustment hole to a respective vibrating arm as required to adjust a vibration frequency of the vibrating arm and after vacuum-evacuating the package.

18. The piezoelectric device of claim 6, further comprising a seal in the at least one frequency-adjustment hole, the seal being formed after passing a laser beam through the frequency-adjustment hole to a respective vibrating arm as required to adjust a vibration frequency of the vibrating arm and after vacuum-evacuating the package.

19. The piezoelectric device of claim 7, further comprising a seal in the at least one frequency-adjustment hole, the seal being formed after passing a laser beam through the frequency-adjustment hole to a respective vibrating arm as required to adjust a vibration frequency of the vibrating arm and after vacuum-evacuating the package.

20. The piezoelectric device of claim 10, further comprising a seal in the at least one frequency-adjustment hole, the seal being formed after passing a laser beam through the frequency-adjustment hole to a respective vibrating win as required to adjust a vibration frequency of the vibrating arm and after vacuum-evacuating the package.

21. The piezoelectric device of claim 13, further comprising a seal in the at least one frequency-adjustment hole, the seal being formed after passing a laser beam through the frequency-adjustment hole to a respective vibrating arm as required to adjust a vibration frequency of the vibrating arm and after vacuum-evacuating the package.

22. The piezoelectric device of claim 1, further comprising:
a respective frequency-adjustment hole corresponding to each vibrating arm; and
a seal in each frequency-adjustment hole, the seals being formed after adjusting vibration frequency of the vibrating arms by laser ablation using a laser beam passed through the frequency-adjustment holes to the respective vibrating arms as required to adjust a vibration frequency of the vibrating arms and after vacuum-evacuating the package.

23. The piezoelectric device of claim 2, further comprising:
a respective frequency-adjustment hole corresponding to each vibrating arm; and
a seal in each frequency-adjustment hole, the seals being formed after adjusting vibration frequency of the vibrating arms by laser ablation using a laser beam passed through the frequency-adjustment holes to the respective vibrating arms as required to adjust a vibration frequency of the vibrating arms and after vacuum-evacuating the package.

24. The piezoelectric device of claim 3, further comprising:
a respective frequency-adjustment hole corresponding to each vibrating arm; and
a seal in each frequency-adjustment hole, the seals being formed after adjusting vibration frequency of the vibrating arms by laser ablation using a laser beam passed through the frequency-adjustment holes to the respective vibrating arms as required to adjust a vibration frequency of the vibrating arms and after vacuum-evacuating the package.

25. The piezoelectric device of claim 4, further comprising:
a respective frequency-adjustment hole corresponding to each vibrating arm; and
a seal in each frequency-adjustment hole, the seals being formed after adjusting vibration frequency of the vibrating aims by laser ablation using a laser beam passed through the frequency-adjustment holes to the respective vibrating arms as required to adjust a vibration frequency of the vibrating arms and after vacuum-evacuating the package.

26. The piezoelectric device of claim 6, further comprising:
a respective frequency-adjustment hole corresponding to each vibrating arm; and
a seal in each frequency-adjustment hole, the seals being formed after adjusting vibration frequency of the vibrating arms by laser ablation using a laser beam passed through the frequency-adjustment holes to the respective vibrating arms as required to adjust a vibration frequency of the vibrating arms and after vacuum-evacuating the package.

27. The piezoelectric device of claim 7, further comprising:
a respective frequency-adjustment hole corresponding to each vibrating arm; and
a seal in each frequency-adjustment hole, the seals being formed after adjusting vibration frequency of the vibrating arms by laser ablation using a laser beam passed through the frequency-adjustment holes to the respective vibrating arms as required to adjust a vibration frequency of the vibrating arms and after vacuum-evacuating the package.

28. The piezoelectric device of claim 10, further comprising:
- a respective frequency-adjustment hole corresponding to each vibrating arm; and
- a seal in each frequency-adjustment hole, the seals being formed after adjusting vibration frequency of the vibrating aims by laser ablation using a laser beam passed through the frequency-adjustment holes to the respective vibrating arms as required to adjust a vibration frequency of the vibrating arms and after vacuum-evacuating the package.

29. The piezoelectric device of claim 13, further comprising:
- a respective frequency-adjustment hole corresponding to each vibrating arm; and
- a seal in each frequency-adjustment hole, the seals being formed after adjusting vibration frequency of the vibrating arms by laser ablation using a laser beam passed through the frequency-adjustment holes to the respective vibrating arms as required to adjust a vibration frequency of the vibrating arms and after vacuum-evacuating the package.

30. The piezoelectric device of claim 14, further comprising:
- a respective frequency-adjustment hole corresponding to each vibrating arm; and a seal in each frequency-adjustment hole, the seals being formed after adjusting vibration frequency of the vibrating arms by laser ablation using a laser beam passed through the frequency-adjustment holes to the respective vibrating arms as required to adjust a vibration frequency of the vibrating arms and after vacuum-evacuating the package.

* * * * *

UNITED STATES PATENT AND TRADEMARK OFFICE
CERTIFICATE OF CORRECTION

PATENT NO.        : 8,227,958 B2
APPLICATION NO.   : 12/703473
DATED             : July 24, 2012
INVENTOR(S)       : Inoue et al.

Page 1 of 1

It is certified that error appears in the above-identified patent and that said Letters Patent is hereby corrected as shown below:

In the Claims:

Column 15, line 63, claim 20, "win" should read --arm--

Signed and Sealed this
First Day of April, 2014

Michelle K. Lee
*Deputy Director of the United States Patent and Trademark Office*